United States Patent
Kibbel et al.

(10) Patent No.: US 6,313,016 B1
(45) Date of Patent: Nov. 6, 2001

(54) METHOD FOR PRODUCING EPITAXIAL SILICON GERMANIUM LAYERS

(75) Inventors: Horst Kibbel, Erbach; Jessica Kuchenbecker, Ulm, both of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/469,752

(22) Filed: Dec. 22, 1999

(30) Foreign Application Priority Data

Dec. 22, 1998 (DE) ............................................. 198 59 429

(51) Int. Cl.$^7$ ...................................................... H01L 21/20
(52) U.S. Cl. ............................................. 438/478; 438/796
(58) Field of Search ..................................... 438/378, 478, 438/479, 481, 483, 475, 795, 933, 938, 502, 509, 312, 796, 799; 117/2, 7

(56) References Cited

U.S. PATENT DOCUMENTS

| 5,256,550 | 10/1993 | Laderman et al. . |
| 5,273,930 | 12/1993 | Steele et al. . |
| 5,891,769 | * 4/1999 | Liaw et al. ............................. 438/167 |

* cited by examiner

Primary Examiner—Savitri Mulpuri
(74) Attorney, Agent, or Firm—Venable; Norman N. Kunitz

(57) ABSTRACT

A method for producing relaxed epitaxy layers on a semiconductor substrate by an epitaxy process, particularly molecular beam epitaxy, with a hydrogen source, wherein the following steps occur during an in situ process sequence: a hydrogen-containing intermediate layer is deposited on the substrate surface or diffused into the substrate near the surface; a strained epitaxy layer is grown on this intermediate layer; and the epitaxial layer subsequently is relaxed by a temperature treatment. A preferred layer sequence formed according to the above method includes a substrate of silicon with a hydrogen-containing intermediate layer that is deposited thereon or diffused into the substrate surface; a relaxed $Si_{1-x}Ge_x$ epitaxial layer with a germanium concentration of x=0.1 to 0.3 as a first buffer layer; a hydrogen-containing intermediate layer deposited on or diffused into an outer surface of the first buffer layer; a $Si_{1-x}Ge_x$ relaxed epitaxy layer with a germanium concentration of x=0.3 to 0.5 as second buffer layer; and, a $Si_{1-x}Ge_x$ component structure. Additional relaxed $Si_{1-x}Ge_x$ epitaxy layers with increasing germanium concentrations up to a maximum x=1 may be disposed between the second buffer layer and the component structure layer.

13 Claims, 4 Drawing Sheets

METHOD FOR PRODUCING EPITAXIAL SILICON GERMANIUM LAYERS

Priority is claimed herein with respect to Application No. 198 59 429.1 filed in the German Patent Office on Dec. 22, 1998, the disclosure of which is incorporated herein by reference.

BACKGROUND OF THE INVENTION

The present invention relates to a method for producing lattice-adapted or relaxed silicon germanium layers on a semiconductor substrate by an epitaxy process, particularly the molecular beam epitaxy, with a hydrogen source. The present invention additionally relates to a layer sequence produced according to the method of the invention.

Many high-frequency components that are based on the SiGe/Si material system require a substrate, for which the lattice constant can be adapted to be between that of pure silicon and that of pure germanium. The lattice misfit of this material system is 2.4% for pure geranium, relative to the Si. If a mixed crystal layer with the composition $Si_{1-x}Ge_x$ (wherein x indicates the share of germanium) is deposited epitaxially and mono-crystalline on a silicon substrate, an elastic strain initially occurs in the growing $Si_{1-x}Ge_x$ layer (see FIG. 1a). After the so-called critical layer thickness has been exceeded, this elastic strain is reduced through the formation of misfit dislocations, preferably near the boundary layer (see FIG. 1b). The critical layer thickness depends on the germanium concentration x and the growth temperature. The misfit dislocations, which occur parallel to the boundary layer, are accompanied by a high number of dislocations, found within the $Si_{1-x}Ge_x$ buffer layer extending from the boundary layer SiGe/Si (interface) to the surface of the epitaxial layer (FIG. 2). The thread-type dislocations, which in the FIG. 2 extend to the surface and are referred to in scientific usage as "threading" dislocations, interfere with the function of active component layers and should therefore be suppressed if possible.

Such high-quality mono-crystalline, lattice-adapted SiGe layers are realized as follows in the form of synthetic substrates on a standard silicon substrate by molecular beam epitaxy or by means of precipitation from a reactive gas phase in a chemical vapor deposition method (CVD method), depending on the layer thickness:

a) With thick buffers in the layer thickness range of more than 1 μm, the germanium content increases continuously or in stages during the growth, wherein a germanium content increase of, for example, 10% per μm SiGe layer thickness is used as a basis. As a rule, the growth temperature is reduced to suppress the three-dimensional growth with increasing germanium.

With this solution, the lattice adaptation between the silicon substrate and the growing SiGe layer occurs through strain-driven adaptation dislocations in the growing SiGe layer during the growth period (F. Schäffler, Semicond. Sci. Technol. 12, 1515 (1997) and T. Hackbarth, H. Kibbel, M. Glueck, G. Hoeck, H.-J. Herzog, Thin Solid Films, 321 (1998), 136–140).

The disadvantage of this method is that the final germanium concentration required for the SiGe layer that functions as a buffer layer for electronic components can be achieved only with a particularly high layer thickness. As a result of the layer thickness, height differences result on a common wafer, e.g., with silicon components, which are irreconcilable with modern integration technology or at least cause difficulties during the up-integration.

Furthermore, the surface topography of these thick SiGe buffer layers, which are grown at high temperatures, already has disadvantages for the subsequently applied structures with thin individual films since the faults in the surface structure can have a dimension that is vertically comparable to the active component layers.

b) For thin buffer layers in the layer thickness range of less than 1 μm, a strained non-lattice adapted SiGe buffer layer with constant or even graded germanium content is deposited epitaxially. This layer is subsequently implanted with hydrogen atoms and is relaxed through a subsequent tempering process with protective gas. The hydrogen dose and energy are selected such that a maximum hydrogen concentration is still located inside the silicon substrate, but relatively close to the boundary layer to the SiGe buffer layer. The subsequent tempering process takes place at temperatures in the range of 800° C. and leads to a lattice adaptation through adaptation dislocations, which extend primarily in the thin silicon layer between the boundary layer and the maximum hydrogen concentration (S. Mantl, B. Holländer, R. Liedke, 5. Mesters, H.-J. Herzog, H. Kibbel, T. Hackbarth, "Thin Solid Films," presently in print, published by EMRS, Strassburg, 1998).

This solution has disadvantages because it requires an implantation with relatively high energies that normally occurs outside of the epitaxy arrangement—ex situ—in connection with a subsequent tempering process for relaxation. The actual component structure can be allowed to grow only after that on the relaxed SiGe layer. The wafer transfer that follows the $1^{st}$ epitaxy stage for implantation and tempering, which implantation and tampering takes place outside of the epitaxy arrangement, makes it more difficult to continue the subsequent epitaxy because it requires a new pre-preparation of the wafer. Furthermore, the implantation of hydrogen involves the danger of crystal damage on the surface or in the volume. This damage cannot be healed by the relaxation of the SiGe buffer layer through a thermal treatment because the implanted hydrogen in the process is also thinned through diffusion in the volume and loses its relaxation-supporting property.

If the necessary final germanium concentration additionally cannot be achieved in a sequence of steps involving epitaxy, H-implantation and tempering, the aforementioned procedure would have to be carried out in several stages. Owing to the fact that a multiple pre-preparation is necessary, this would hurt the crystal quality.

Furthermore, considerably higher temperatures are needed for relaxation, which, in combination with the hydrogen that is present, can lead to a higher diffusion in already existing component structures. The required implantation arrangement is also very expensive, owing to the complexity of such arrangements.

In addition to the molecular beam epitaxy, a precipitation of epitaxial layers from a chemically reactive gas (CVD method) is standard and is widely used because of its economic advantages. However, the precipitation of layers by means of CVD generally does not provide the variability in the process control, which would be necessary in the limit regions of kinetically controlled surface reactions in order to achieve an especially good layer quality. For the most part, this method necessitates operating at an undesirable and much higher temperature range.

A method for cleaning the surface of a semiconductor material by using hydrogen-containing plasma is known from the references EP 0 746 011 A2 and EP 0 493 278 A1. With this method, a natural oxidation layer on a silicon substrate is removed prior to a depositing process. The silicon surface cleaned in this way is then covered with an essentially mono-atomic hydrogen coating. Normally, the temperatures for the cleaning process as well as the subsequent layer deposit are in the range of approximately 800° C., sometimes even in the range of 1000° C. and above. As a result of such high temperatures and the kinetic reaction of the gaseous phase with the substrate surface, a more or less closed hydrogen surface is always replaced in a chemical reaction with the layer-forming species during the layer-depositing stage. The growth then continues with the newly forming layer surface.

However, given such growth conditions, it appears to be nearly impossible with respect to process technology to purposely introduce hydrogen to a very limited region of a layer surface.

Therefore, it is the object of the present invention to provide a layer sequence, as well as a method of producing this layer sequence, which makes it possible to produce thin, lattice-adapted semiconductor layers with low dislocation density on the surface.

SUMMARY OF THE INVENTION

According to a first aspect of the invention, there is achieved by a method for producing relaxed epitaxy layers on a semiconductor substrate by an epitaxy process, in particular the molecular beam epitaxy, in connection with a hydrogen source and an in situ process sequence. For this, a hydrogen-containing intermediate layer either is deposited on the substrate surface or a diffusion layer is diffused on or near the substrate surface. A strained epitaxy layer their is grown on the intermediate layer and is subsequently relaxed with the aid of a temperature treatment, at a comparably low temperature.

One particular advantage of the invention is that the production process according to the invention offers the option of realizing the complete vertical layer structure in situ, without interrupting the vacuum, thereby ensuring a far-reaching suppression of threading dislocations extending to the surface. A multi-stage sequence of relaxed layers is even possible without problems and without atmospheric transport.

Another special advantage can be found in the low thermal budget for the tempering. If applicable, it is even possible to partially position the lattice-adapted SiGe buffer layers with silicon technology during the processing of component structures that already exist on the substrate. Such compatible process conditions, which are above all caused by the low temperature budget, do not have negative consequences for the structures already existing on the substrate.

The invention is explained below in further detail with the aid of advantageous exemplary embodiments and by referring to the schematic drawings in the FIGURES.

DETAILED DESCRIPTION OF PREFERRED EMBODIMENT

As indicated above the initial step in the method is to form a hydrogen-containing intermediate layer on the outer surface of the substrate on which the epitaxy layers are to be formed. The intermediate layer can be produced in three different ways.

Figure 1A:
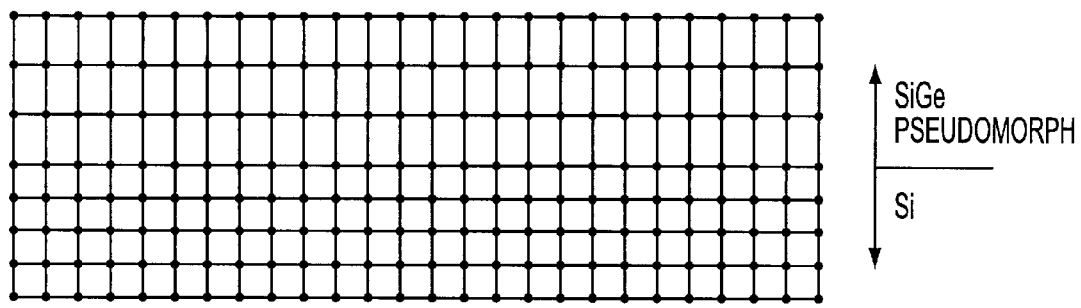
FIG. 1a schematically shows an atomic lattice with epitaxially precipitated $Si_{1-x}Ge_x$ layer on mono-crystalline silicon with elastic strain according to the prior art.
Figure 1B:
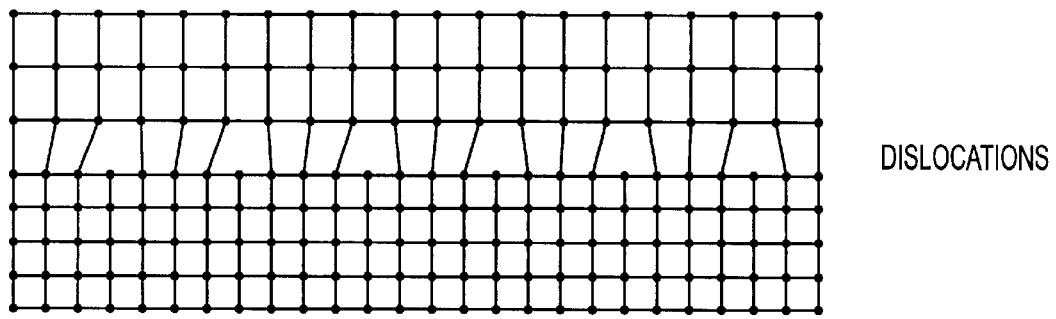
FIG. 1b schematically shows an atomic lattice for an epitaxially precipitated $Si_{1-x}Ge_x$ layer on mono-crystalline silicon, with the formation of misfit dislocations near the boundary surface with relaxation of strain according to the prior art.
Figure 2:
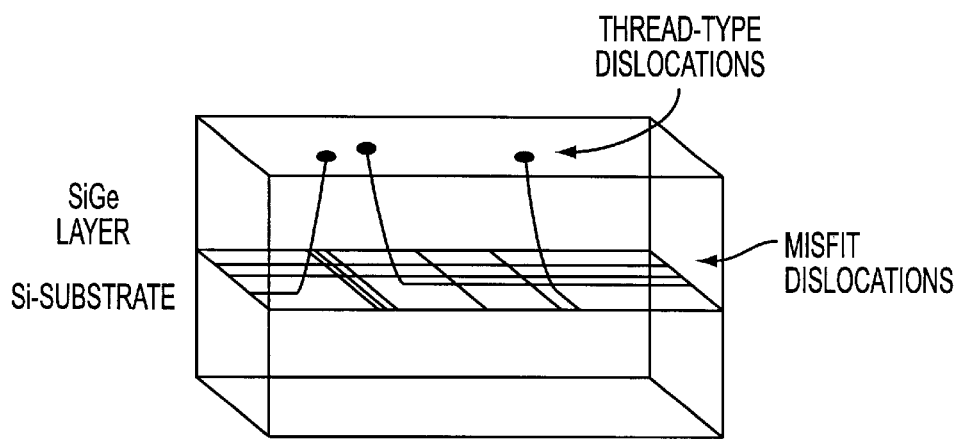
FIG. 2 is a schematic representation of the formation and course of threading dislocations and misfit dislocations in the crystalline volume according to the prior art.
Figure 3A:
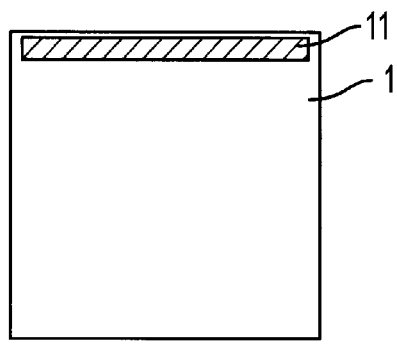
FIG. 3a shows the deposit of hydrogen in the substrate near the surface.
Figure 3B:
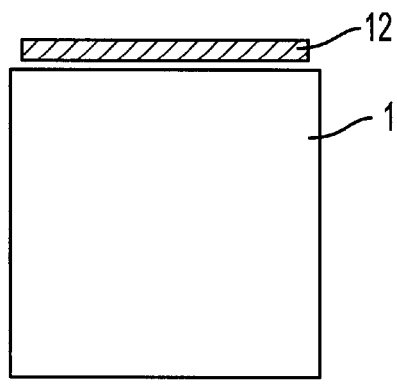
FIG. 3b shows the deposit of hydrogen through reactive, epitaxial layer precipitation on the substrate surface.
Figure 3C:
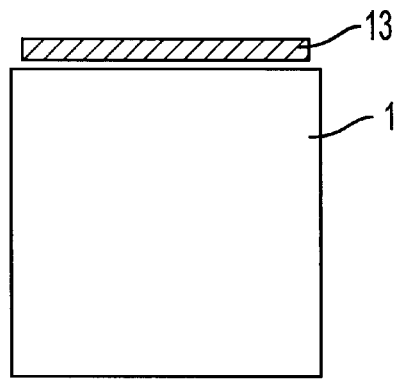
FIG. 3c shows the deposit of hydrogen on the substrate surface.

1. As shown in FIG. 3a, the diffusion layer is diffused into the substrate surface through thermally and/or plasma-supported inward diffusion of hydrogen, wherein the concentration of the inward diffused hydrogen at the substrate surface reaches a maximum concentration in the order of magnitude of $10^{19}$ to $10^{21}$ $cm^{-3}$.
2. As shown in FIG. 3b, the intermediate layer is deposited with a thickness between several atomic layers and to 10 nm, through reactive epitaxy at a temperature of a maximum of 500° C. by mixing in hydrogen in high concentrations. In the process, the hydrogen concentration in the layer reaches the order of magnitude of $10^{13}$ to $10^{14}$ $cm^{-2}$ (or $10^{19}$ to $10^{21}$ $cm^{-3}$).
3. The intermediate layer is produced as a mono-atomic film on the substrate surface with a concentration in the order of magnitude of $10^{14}$ to $10^{15}$ $cm^{-2}$ by forming Si—H bonds, as illustrated in FIG. 3c.

With all three variants, the temperature treatment occurs the range of 450 to 650° C. The hydrogen source used for a molecular beam epitaxy arrangement preferably is low-energy plasma or a $H/H_2$ molecular beam source.

The semiconductor substrate consists of either silicon or an optional SiGe alloy. The alloy can also be grown on an original silicon substrate and, during the continued process sequence, can take on the function of a new substrate for the subsequent layers. In this way, several relaxed epitaxy layers—even up to a germanium content of x=1—can be precipitated out sequentially during the in situ process sequence. An additional buffer layer or a layer needed for the component production then follows as the top epitaxy layer.

Figure 4A:
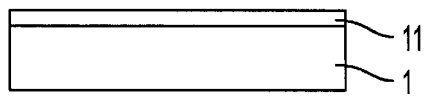
FIGS. 4a–4g shows a layer sequence, consisting of several sequentially precipitated, relaxed epitaxy layers, as well as an additional coating layer according to the invention.
Figure 4B:
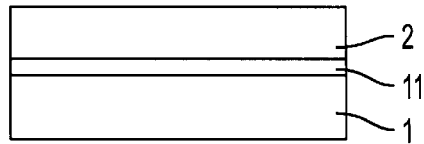
Figure 4C:
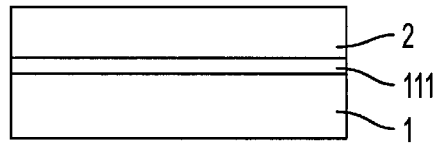
Figure 4D:
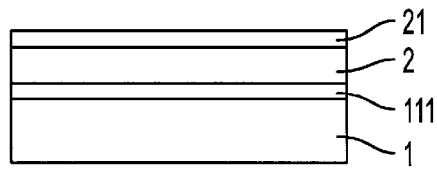

In a first exemplary embodiment according to the invention, as shown in FIGS. 4a–4g, the threading dislocations extending to the layer surface are for the most part suppressed for thin buffer layers with a layer thickness below 1 μm. This process involves a 2-stage pre-treatment, growth and an intermediate treatment, of the SiGe buffer layer formed on a silicon substrate 1, as an epitaxial layer. In the process, the surface of substrate 1, on which epitaxial-growth is later to take place, is exposed to a hydrogen source in such a way that the hydrogen is diffused near the surface into the crystal volume as shown in FIG. 4a. The associated first diffusion profile 11 is shown in FIG. 5 with the example of the concentration course for a plasma-supported inward diffusion where the maximum value is near the substrate surface. Hydrogen concentrations in the range of $10^{20}$ cm$^{-3}$ can be achieved near the surface.

In a subsequent process step (FIG. 4b), a first $Si_{1-x}Ge_x$ buffer layer 2 with, for example, x=0.2 and 150 nm thickness is grown, e.g., at a growth temperature of, for example, 550° C. and growth rates of approximately 0.3 nm/s.

Figure 6:
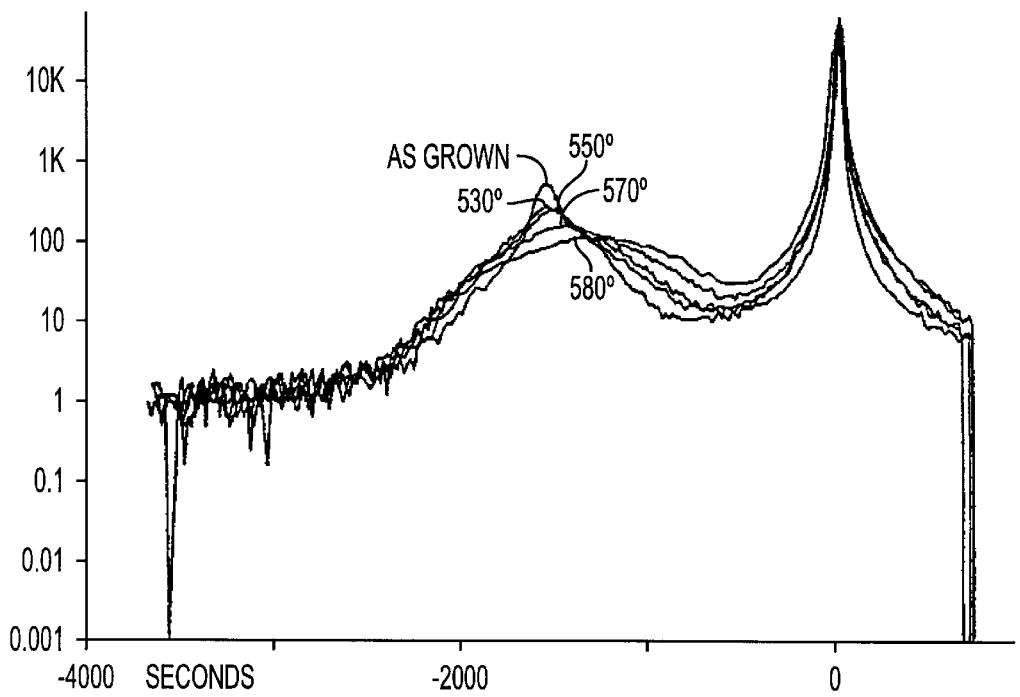
FIG. 6 shows the Rocking curve for layer sequences, which were processed at different temperatures; measuring of the strain reduction through a change in the lattice constant of the epitaxy layer.

Following this, the silicon substrate 1 with the first $Si_{1-x}Ge_x$ buffer layer 2 is heated in situ to 590° C., causing the $Si_{1-x}Ge_x$ buffer layer 2 to relax by forming primarily misfit dislocations. The dislocations are formed along a first hydrogen-containing boundary surface 111 of the substrate 1 and epitaxial layer 2. FIG. 6 provides an overview of the relaxation process in the shape of a Rocking curve, in dependence on the temperature ranging from 530 to 590° C. With the measuring curves shown in FIG. 6, the strain reduction is detected through the change in the grid constant of the epitaxy layer. With this, the first $Si_{1-x}Ge_x$ buffer layer 2 is now thermally stable and the deposited hydrogen is no longer effective after the tempering through diffusion to the surface and thinning of the volume.

In an additional process step (FIG. 4d), the existing layer stack 1, 111, 2 is again subjected to hydrogen diffusion to produce in turn a second diffusion profile 21 in the layer 2, which is shown in FIG. 4.

Figure 4E:
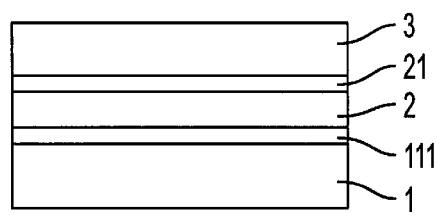
Figure 4F:
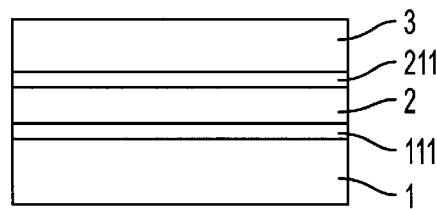
Figure 4G:
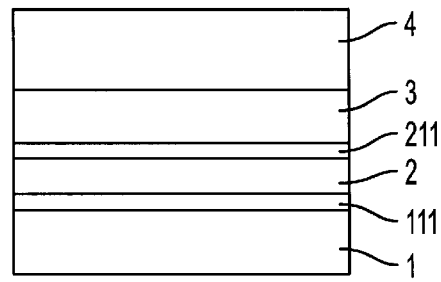
Figure 5:
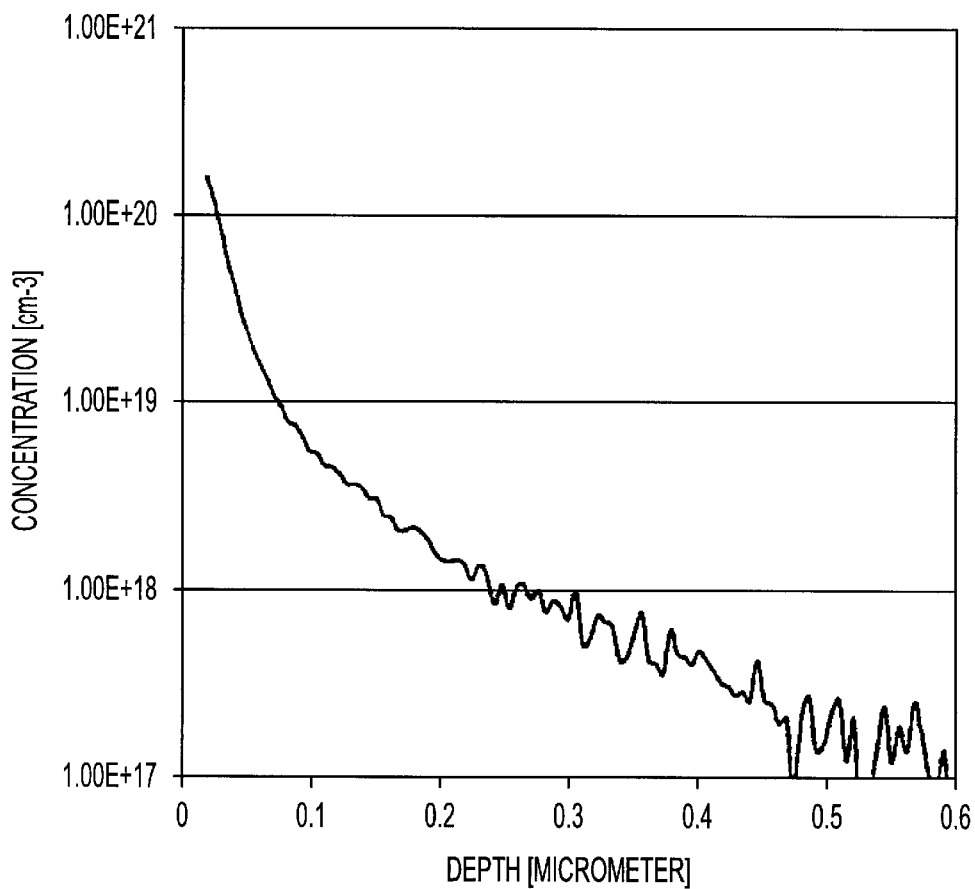
FIG. 5 shows the concentration progression for inward diffused hydrogen with a maximum value at the substrate surface.

Following this, a second $Si_{1-x}Ge_x$ buffer layer 3 with, for example, x=0.4 and 150 nm thickness is grown (FIG. 4e). The relative increase in the germanium concentration as compared to the first buffer layer 2 in turn is 0.2. This takes place again at a growth temperature of, for example, 550° C. with growth rates of approximately 0.3 nm/s.

In the subsequent process step (FIG. 4f), the layer stack is again tempered in situ at 590° C. to form a thermally stable second buffer layer 3. As before, the deposited hydrogen forming a second hydrogen-containing boundary surface 211 is ineffective following the tempering through diffusion to the surface and the thinning of the volume. Thus, the preconditions for a subsequent precipitation of a vertical component structure 4 have been created and the structure layer 4 is precipitated immediately afterwards.

The hydrogen diffusion process occurs for all process steps in the growth chamber itself or in a preparation chamber that is directly connected to it.

The invention has been described in detail with respect to preferred embodiments, and it will now be apparent from the foregoing to those skilled in the art that changes and modifications may be made without departing from the invention in its broader aspects. The invention, therefore, as defined in the appended claims, is intended to cover all such changes and modifications as to fall within the true spirit of the invention.

What is claimed is:

1. A method for producing relaxed epitaxy layers on a semiconductor substrate by an epitaxy process with a hydrogen source, said method comprising the following steps occurring during an in situ process sequence:
   (a) forming a hydrogen-containing intermediate layer at a substrate surface by one of deposition of the intermediate layer on the substrate surface and diffusing hydrogen into the substrate near the substrate surface;
   (b) growing a strained epitaxy layer on the intermediate layer;
   (c) subjecting the strained epitaxial layer to a temperature treatment;
   (d) repeating steps (a), (b) and (c) to successively precipitate several relaxed epitaxial layers, using the last formed relaxed epitaxial layer as the substrate, during the in situ process sequence; and,
   (e) epitaxially growing a component structure layer on the outermost epitaxial layer resulting from step (d).

2. The method according to claim 1, wherein the step of forming comprises diffusing a diffusion layer into the substrate surface through one of thermal and plasma-supported inward diffusion of hydrogen.

3. The method according to claim 2, wherein the concentration of inward diffused hydrogen at the substrate surface reaches a maximum concentration in the order of magnitude of $10^{19}$ to $10^{21}$ cm$^{-3}$.

4. The method according to claim 1, wherein the step of forming comprises depositing a thin intermediate layer with high hydrogen concentration on the substrate surface through reactive epitaxy and the admixture of hydrogen.

5. The method according to claim 4, wherein the intermediate layer is deposited with a thickness between several atomic layers up to 10 nm.

6. The method according to claim 4, wherein the concentration of hydrogen in the deposited intermediate layer reaches the order of magnitude of $10^{13}$ to $10^{14}$ cm$^{-2}$ (or $10^{19}$ to $10^{21}$ cm$^{-3}$).

7. The method according to claim 1, wherein the step of forming comprises producing the intermediate layer through a mono-atomic film on the substrate surface.

8. The method according to claim 7, wherein the mono-atomic film reaches a concentration in the order of magnitude of $10^{14}$ to $10^{15}$ cm$^{-2}$.

9. The method according to claim 1, wherein the temperature treatment is carried out in the range or 450 to 650° C.

10. The method according to claim 1, wherein one of a low-energy plasma and an $H/H_2$ molecular beam source is used as the hydrogen source for the precipitation of the hydrogen-containing intermediate layer.

11. The method according claim 1, wherein the semiconductor substrate consists of one of silicon and an optional SiGe alloy.

12. A method for producing relaxed epitaxial layers on a semiconductor substrate by an epitaxy process with a hydrogen source, said method comprising the following steps occurring di an in situ process sequence:
   (a) forming a hydrogen-containing intermediate layer at a surface of a substrate, consisting of one of silicon and an optional SiGe alloy, by one of deposition of the intermediate layer on the substrate surface and diffusing hydrogen into the substrate near the substrate surface;
   (b) growing a stained epitaxial layer of $Si_{1-x}Ge_x$ on the intermediate layer;
   (c) subjecting the strained epitaxial layer to a temperature treatment to form a relaxed $Si_{1-x}Ge_x$ epitaxial layer;
   (d) repeating steps (a), (b) and (c) to successively precipitate several relaxed $Si_{1-x}Ge_x$ epitaxial layers, using the last formed relaxed $Si_{1-x}Ge_x$ epitaxial layer as the substrate, during the in situ process sequence, with subsequent $Si_{1-x}G_x$ epitaxial layers having an increasing germanium concentration up to x=1; and,
   (e) epitaxially growing a component structure layer of $Si_{1-x}Ge_x$ on an outer surface of the outermost epitaxial layer resulting from step (d).

13. The method according to claim 12 wherein x=0.1 to 0.3 of a first formed of the epitaxial layers and with x=0.3 to 0.5 for a second formed of the epitaxial layers.

* * * * *